US009941875B2

(12) United States Patent
Srinivasan et al.

(10) Patent No.: US 9,941,875 B2
(45) Date of Patent: *Apr. 10, 2018

(54) TESTING OF POWER ON RESET (POR) AND UNMASKABLE VOLTAGE MONITORS

(71) Applicant: STMicroelectronics International N.V., Schiphol (NL)

(72) Inventors: Venkata Narayanan Srinivasan, Gautam Budh Nagar District (IN); Srinivas Dhulipalla, Prakasam (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/615,178

(22) Filed: Jun. 6, 2017

(65) Prior Publication Data

US 2018/0013418 A1    Jan. 11, 2018

Related U.S. Application Data

(63) Continuation of application No. 15/203,461, filed on Jul. 6, 2016, now Pat. No. 9,698,771.

(51) Int. Cl.
*H03K 17/22* (2006.01)
*H03K 19/20* (2006.01)
*H03K 5/19* (2006.01)

(52) U.S. Cl.
CPC ............. *H03K 17/223* (2013.01); *H03K 5/19* (2013.01); *H03K 19/20* (2013.01)

(58) Field of Classification Search
CPC ........ H03K 5/19; H03K 17/22; H03K 17/223; H03K 19/20
USPC ......................................... 327/142, 143, 198
See application file for complete search history.

(56) References Cited

U.S. PATENT DOCUMENTS

| 5,864,247 | A  | * | 1/1999 | Hirano | ............... | G01R 19/0084 |
| | | | | | | 327/143 |
| 9,471,120 | B1 | * | 10/2016 | Thakur | ..................... | G06F 1/24 |
| 2003/0062552 | A1 | * | 4/2003 | Takata | ..................... | G06F 1/24 |
| | | | | | | 257/295 |
| 2007/0170960 | A1 | * | 7/2007 | Sakai | ....................... | G06F 1/24 |
| | | | | | | 327/142 |

* cited by examiner

*Primary Examiner* — William Hernandez
(74) *Attorney, Agent, or Firm* — Gardere Wynne Sewell LLP

(57) ABSTRACT

A power management circuit includes both a power on reset (POR) circuit and a voltage monitoring circuit. Explicit testing of these circuits is accomplished by controlling voltages applied to the circuits and monitoring an output signal responsive to a logical combination of outputs from the POR circuit and voltage monitoring circuit. The applied voltages are controlled with respect to timing of application, fixing of voltages and varying of voltages in a manner where a certain one of the circuits for explicit test is isolated with change in logic state of the output signal being indicative of operation of that isolated circuit.

11 Claims, 6 Drawing Sheets

TESTING OF POWER ON RESET (POR) AND UNMASKABLE VOLTAGE MONITORS

CROSS REFERENCE TO RELATED APPLICATION

This application is a continuation of U.S. patent application Ser. No. 15/203,461 filed Jul. 6, 2016, the disclosure of which is incorporated by reference.

TECHNICAL FIELD

The present invention relates to a test circuitry for integrated circuit devices and, in particular, to test circuitry used to test operation of power on reset (POR) circuits and unmaskable voltage monitor circuits.

BACKGROUND

It is well known in the art for an integrated circuit device to include a power on reset (POR) circuit. The POR circuit is an indispensable component of many integrated circuit devices, such as system on chip (SoC) devices. The POR circuit functions to provide a reset signal to the digital state machine of the SoC during power up and supply brown out conditions. As a result, the digital state machine of the SoC starts and operates in a controlled manner.

It is also known in the art for an integrated circuit device to include one or more voltage monitor circuits. Such circuits function to monitor the supply voltage and provide information indicative of supply voltage conditions. For example, over-voltage and under-voltage conditions could be monitored. The integrated circuit may include power management circuits which respond to the supply voltage condition information provided by the voltage monitor circuits and act in response thereto to correct circuit operation, protect the circuit from damage and/or reset operation of the circuit to a known, safe state.

For testing purposes, the POR circuit and any unmaskable voltage monitor circuits are implicitly tested during power ramp-up when the integrated circuit comes out of reset and begins working properly. There is no satisfactory method, however, for explicitly testing the POR circuit and any unmaskable voltage monitor circuits during power ramp-down because the device is reset relative to the operating voltage thresholds of the circuits.

There is a need in the art to provide for explicit testing of such circuits.

SUMMARY

In an embodiment, a power on reset (POR) circuit configured to monitor a supply voltage and output a POR signal in response to a comparison of the supply voltage to a POR threshold voltage; a first voltage monitoring circuit configured to monitor an input voltage and output a first voltage monitoring signal in response to a comparison of the input voltage to a first voltage monitoring threshold; an analog multiplexer circuit having a first input configured to receive the supply voltage and a second input configured to receive a variable test voltage, said analog multiplexer having an output providing said input voltage to the first voltage monitoring circuit, said analog multiplexer further having a control input configured to receive a control signal for selecting between the first and second inputs; and logic circuitry configured to logically combine the POR signal and the first voltage monitoring signal.

In an embodiment, a method for explicit testing of a power management circuit including a power on reset (POR) circuit having a POR threshold voltage and a first voltage monitoring circuit having a first voltage monitoring threshold, comprises: applying a fixed test voltage to the first voltage monitoring circuit in substitution for a supply voltage, wherein said fixed test voltage is higher than the first voltage monitoring threshold voltage; decreasing said supply voltage applied to the POR circuit; logically combining outputs of the POR circuit and first voltage monitoring circuit to generate an output signal indicating existence of a below threshold voltage condition for either of the POR circuit or the first voltage monitoring circuit; and monitoring for a change in said output signal in response to the decreasing supply voltage falling below said POR threshold voltage to indicate whether the POR circuit is operating properly.

In an embodiment, a method for explicit testing of a power management circuit including a power on reset (POR) circuit having a POR threshold voltage and a first voltage monitoring circuit having a first voltage monitoring threshold, comprises: applying a supply voltage to the POR circuit that is higher than the POR threshold voltage; applying a test voltage to the first voltage monitoring circuit in substitution for said supply voltage; decreasing the test voltage; logically combining outputs of the POR circuit and first voltage monitoring circuit to generate an output signal indicating existence of a below threshold voltage condition for either of the POR circuit or the first voltage monitoring circuit; and monitoring for a change in said output signal in response to the decreasing test voltage falling below said first voltage monitoring threshold voltage to indicate whether the first voltage monitoring circuit is operating properly.

In an embodiment, a circuit comprises: a power on reset (POR) circuit configured to monitor a supply voltage and output a POR signal in response to a comparison of the supply voltage to a POR threshold voltage; a first voltage monitoring circuit configured to monitor a fixed test voltage applied in substitution for the supply voltage and output a first voltage monitoring signal in response to a comparison of the fixed test voltage to a first voltage monitoring threshold that is greater than the POR threshold voltage; logic circuitry configured to logically combine the POR signal and the first voltage monitoring signal to generate an output signal indicating existence of a below threshold voltage condition for either the POR circuit or the first voltage monitoring circuit; wherein, during testing of the POR circuit, the supply voltage is decreased with a change in state of the output signal during said decrease in the supply voltage indicating whether the POR circuit is operating properly.

In an embodiment, a circuit comprises: a power on reset (POR) circuit configured to monitor a supply voltage and output a POR signal in response to a comparison of the supply voltage to a POR threshold voltage; a first voltage monitoring circuit configured to monitor a test voltage applied in substitution for the supply voltage and output a first voltage monitoring signal in response to a comparison of the test voltage to a first voltage monitoring threshold that is greater than the POR threshold voltage; logic circuitry configured to logically combine the POR signal and the first voltage monitoring signal to generate an output signal indicating existence of a below threshold voltage condition for either the POR circuit or the first voltage monitoring circuit; wherein, during testing of the first voltage monitoring circuit, the test voltage is decreased with a change in state of the output signal during said decrease in the test voltage indicating whether the first voltage monitoring circuit is operating properly.

In an embodiment, a circuit comprises: an analog multiplexer circuit having a first input configured to receive a supply voltage and a second input configured to receive a test voltage, said analog multiplexer having an output generating an input voltage comprising a control signal selected one of said first supply voltage and the test voltage; and a voltage monitor circuit configured to compare the input voltage to a threshold voltage and generate an output voltage signal; wherein the control signal selects the supply voltage in a normal operating mode and alternatively selects the test voltage in a test operating mode.

In an embodiment, a testing method comprises: applying a supply voltage to a reset circuit; comparing by the reset circuit of the supply voltage to a reset voltage and generating a first reset signal; applying a fixed test voltage to a voltage monitoring circuit in substitution for application of said supply voltage; comparing by the voltage monitoring circuit of the fixed test voltage to a threshold voltage, wherein the fixed test voltage is in excess of the threshold voltage, to generate an output signal; logically combining the first reset signal and the output signal to generate a second reset signal; decreasing the supply voltage applied to the reset circuit; and monitoring for a change of state of the second reset signal in response to the decreasing supply voltage.

In an embodiment, a testing method comprises: applying a supply voltage to a reset circuit; comparing by the reset circuit of the supply voltage to a reset voltage and generating a first reset signal; applying a variable test voltage to a voltage monitoring circuit in substitution for application of said supply voltage; comparing by the voltage monitoring circuit of the variable test voltage to a threshold voltage, wherein the variable test voltage has an initial value in excess of the threshold voltage, to generate an output signal; logically combining the first reset signal and the output signal to generate a second reset signal; decreasing the variable test voltage applied to the reset circuit; and monitoring for a change of state of the second reset signal in response to the decreasing variable test voltage falling below the threshold voltage.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
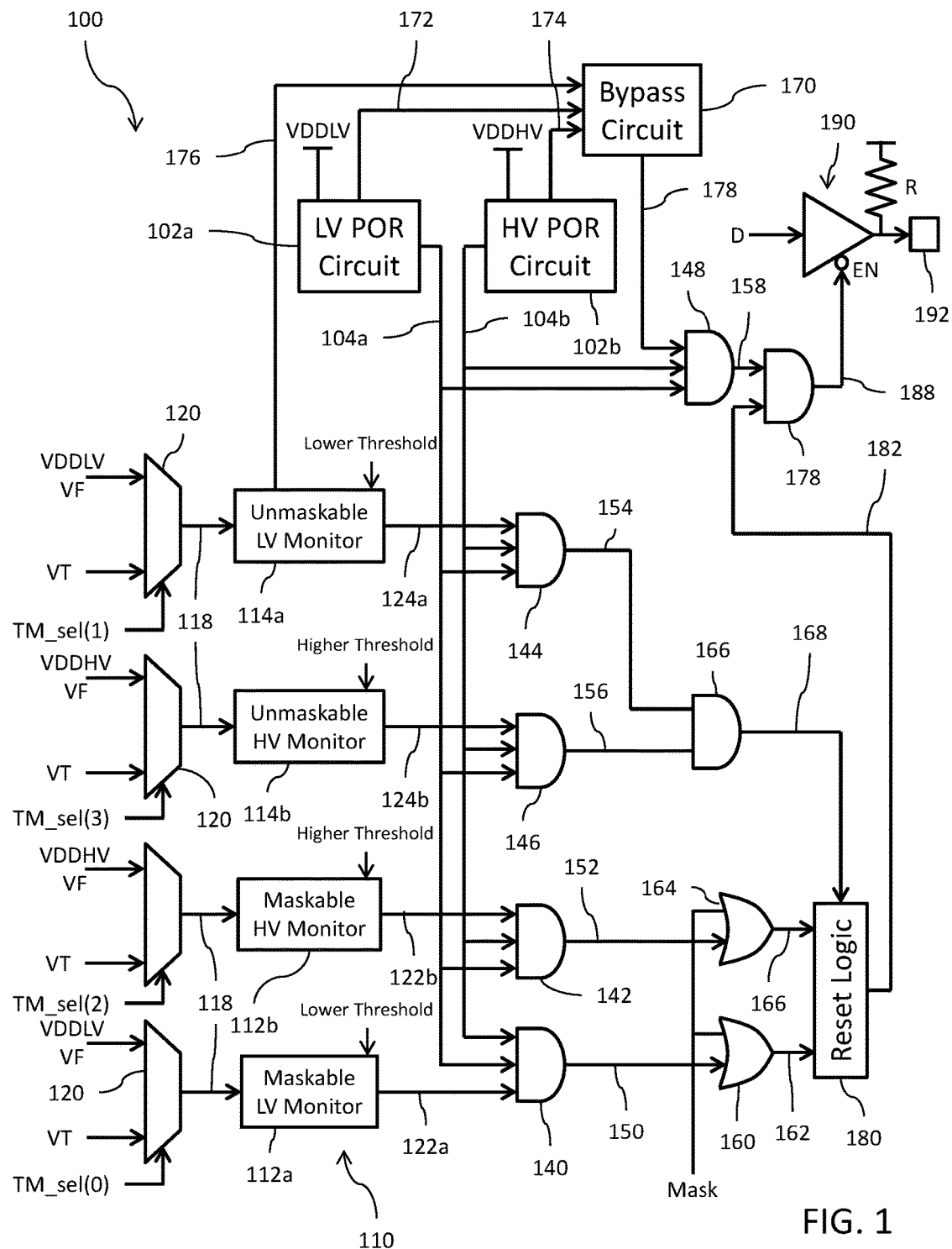
FIG. 1 is a block diagram of a power management circuit.

Reference is now made to FIG. 1 showing a block diagram of a power management circuit 100 for an integrated circuit device. It will be understood that the power management circuit 100 may be just one component part of a system on chip (which may further include a processing component, a memory component, an input/output component, etc.). It is also possible for the power management circuit 100 to be one chip of a multichip circuit solution and thus be connectable to other chips in an assembled system.

The circuit 100 includes two power on reset (POR) circuits 102. A first one of the POR circuits 102a is a low voltage POR circuit which means that the supply voltage being monitored by the low voltage POR circuit is a relatively lower supply voltage (VDDLV) for circuits of an integrated circuit device. The POR circuit 102a monitors the lower supply voltage against a threshold voltage and the output 104a of the POR circuit 102a changes state (for example, to logic high) when the lower supply voltage exceeds that threshold voltage. A second one of the POR circuits 102b is a high voltage POR circuit which means that the supply voltage being monitored by the high voltage POR circuit is a relatively higher supply voltage (VDDHV) for circuits of the integrated circuit device. The POR circuit 102b monitors the higher supply voltage against a threshold voltage and the output 104b of the POR circuit 102b changes state (for example, to logic high) when the higher supply voltage exceeds that threshold voltage.

It will be noted that the low voltage POR circuit 104a can be operational even when the higher supply voltage VDDHV is not available. Conversely, the high voltage POR circuit 104b can be operational even when the lower supply voltage VDDLV is not available. The remaining circuitry discussed herein for the circuit 100 is powered from the higher supply voltage VDDHV and is gated by the outputs 104a and 104b of the POR circuits.

The circuit 100 further includes a number of voltage monitoring circuits 110 whose outputs are valid only when the outputs 104a and 104b of the POR circuits are asserted logic high. The voltage monitoring circuits 110 include maskable voltage monitoring circuits 112 and unmaskable voltage monitoring circuits 114. Each voltage monitoring circuit 110 functions to monitor a voltage 118 against a certain threshold voltage. For example, when operating in a high voltage mode, the voltage monitoring circuit 110 will monitor the voltage (which may be either the higher supply voltage VDDHV or a test voltage) against a relatively higher threshold. Conversely, when operating in a low voltage mode, the voltage monitoring circuit 110 will monitor the voltage (which may be either the lower supply voltage VDDLV or a test voltage) against a relatively lower threshold.

The output 122a of the maskable low voltage monitoring circuit 112a changes state (for example, to logic high) when the monitored voltage 118 exceeds the threshold voltage of the maskable low voltage monitoring circuit 112a. The maskable low voltage monitoring circuit 112a may receive a functional supply voltage (VF) such as the lower supply voltage VDDLV or a test supply voltage (VT) as the monitored voltage 118 to be compared against a relatively lower threshold.

The output 122b of the maskable high voltage monitoring circuit 112b changes state (for example, to logic high) when the monitored voltage 118 exceeds the threshold voltage of the maskable high voltage monitoring circuit 112b. The maskable high voltage monitoring circuit 112b may receive a functional supply voltage (VF) such as the higher supply voltage VDDHV or a test supply voltage (VT) as the monitored voltage 118 to be compared against a relatively higher threshold.

The output 124a of the unmaskable low voltage monitoring circuit 114a changes state (for example, to logic high) when the monitored voltage 118 exceeds the threshold voltage of the unmaskable low voltage monitoring circuit 114a. The unmaskable low voltage monitoring circuit 114a may receive a functional supply voltage (VF) such as the lower supply voltage VDDLV or a test supply voltage VT as the monitored voltage 118 to be compared against a relatively lower threshold.

The output 124b of the unmaskable high voltage monitoring circuit 114b changes state (for example, to logic high) when the monitored voltage 118 exceeds the threshold voltage of the unmaskable high voltage monitoring circuit 114b. The unmaskable high voltage monitoring circuit 114b may receive a functional supply voltage (VF) such as the high supply voltage VDDHV or a test supply voltage VT as the monitored voltage 118 to be compared against a relatively higher threshold.

The illustration of two maskable voltage monitoring circuits 112 and two unmaskable voltage monitoring circuits 114 in FIG. 1 is by way of example only, it being understood that any desired number and type of voltage monitoring circuits 110 may be provided in the circuit 100.

The high supply voltage VDDHV is an externally supplied voltage. The low supply voltage VDDLV may be externally supplied, but more typically is generated on chip using a voltage regulator circuit. The test supply voltage VT is an externally applied voltage supplied by a testing circuit. Circuitry as described below is provided within the power management circuit 100 to selectively apply the test supply voltage VT to a particular one of the voltage monitors 110 during test mode.

The voltage 118 to be monitored by each voltage monitoring circuit 110 against its specified threshold is supplied from a corresponding analog multiplexer circuit 120. Each analog multiplexer circuit 120 has a first input connected to receive a functional supply voltage (VF) and a second input connected to receive the test supply voltage (VT). The functional supply voltage is the normal supply voltage for the particular voltage monitoring circuit 110. Thus, if the voltage monitoring circuit 110 is provided for monitoring the relatively lower supply voltage VDDLV, then the functional supply voltage provided to the analog multiplexer circuit 120 coupled to that voltage monitoring circuit 110 is also the relatively lower supply voltage VDDLV. Conversely, if the voltage monitoring circuit 110 is provided for monitoring the relatively higher supply voltage VDDHV, then the functional supply voltage provided to the analog multiplexer circuit 120 coupled to that voltage monitoring circuit 110 is also the relatively higher supply voltage VDDHV.

A control input of each analog multiplexer circuit 120 is configured to receive a test mode selection signal (TM_sel). The test mode selection signal controls whether the analog multiplexer circuit 120 outputs the functional supply voltage VF or test supply voltage VT as the voltage 118 to its connected voltage monitoring circuit 110. Thus, using the test mode selection signal a control may be exercised individually over the voltage selection operation performed by each of the voltage monitoring circuits 110.

The analog multiplexer circuit 120 for the maskable low voltage monitoring circuit 112a receives the test mode selection signal TM_sel(0), the analog multiplexer circuit 120 for the unmaskable low voltage monitoring circuit 114a receives the test mode selection signal TM_sel(1), the analog multiplexer circuit 120 for the maskable high voltage monitoring circuit 112b receives the test mode selection signal TM_sel(2), and the analog multiplexer circuit 120 for the unmaskable high voltage monitoring circuit 114b receives the test mode selection signal TM_sel(3). The test mode selection signals TM_sel(0)-TM_sel(3) may, for example, be bits of a multibit test mode selection signal Testmode_sel(n:0).

A first logic AND gate 140 logically combines the output 104a of the POR circuit 102a, the output 104b of the POR circuit 102b and the output 122a of the maskable low voltage monitoring circuit 112a. In operation, the output 150 of the first logic AND gate 140 is logic low if any one or more of the outputs 104a, 104b and 122a are logic low, and is logic high only if all of the outputs 104a, 104b and 122a are logic high.

A second logic AND gate 142 logically combines the output 104a of the POR circuit 102a, the output 104b of the POR circuit 102b and the output 122b of the maskable high voltage monitoring circuit 112b. In operation, the output 152 of the second logic AND gate 142 is logic low if any one or more of the outputs 104a, 104b and 122b are logic low, and is logic high only if all of the outputs 104a, 104b and 122b are logic high.

A third logic AND gate 144 logically combines the output 104a of the POR circuit 102a, the output 104b of the POR circuit 102b and the output 124a of the unmaskable low voltage monitoring circuit 114a. In operation, the output 154 of the third logic AND gate 144 is logic low if any one or more of the outputs 104a, 104b and 124a are logic low, and is logic high only if all of the outputs 104a, 104b and 124a are logic high.

A fourth logic AND gate 146 logically combines the output 104a of the POR circuit 102a, the output 104b of the POR circuit 102b and the output 124b of the unmaskable high voltage monitoring circuit 114b. In operation, the output 156 of the fourth logic AND gate 146 is logic low if any one or more of the outputs 104a, 104b and 124b are logic low, and is logic high only if all of the outputs 104a, 104b and 124b are logic high.

A first logic OR gate 160 logically combines the output 150 of the first logic AND gate 140 with a mask signal (Mask). The first logic OR gate 160 thus functions as a pass gate to selectively pass the logic state of the output 150 of the first logic AND gate 140 as a first reset signal 162 when the mask signal is not asserted (i.e., is logic low). When the mask signal is asserted (i.e., is logic high), the first logic OR gate 160 blocks passage of the logic low state of the output 150 of the first logic AND gate 140 for the first reset signal 162.

A second logic OR gate 164 logically combines the output 152 of the second logic AND gate 142 with the mask signal (Mask). The second logic OR gate 164 thus functions as a pass gate to selectively pass the logic state of the output 152 of the second logic AND gate 142 as a second reset signal 166 when the mask signal is not asserted (i.e., is logic low). When the mask signal is asserted (i.e., is logic high), the second logic OR gate 164 blocks passage of the logic low state of the output 152 of the second logic AND gate 142 for the second reset signal 166.

A fifth logic AND gate 166 logically combines the output 154 of the third logic AND gate 144 with the output 156 of the fourth logic AND gate 146 to generate a third reset signal 168. In operation, the reset signal 168 is logic low if any one or more of the outputs 154 and 156 are logic low, and is logic high only if all of the outputs 154 and 156 are logic high.

A bypass logic circuit 170 has an input configured to receive a first input signal 172 from the low voltage POR circuit 102a, an input configured to receive a second input signal 174 from the high voltage POR circuit 102b, and an input configured to receive a third input signal 176 from the unmaskable low voltage monitoring circuit 114a. The signals 172, 174 and 176 are asserted when the corresponding circuits are monitoring a supply voltage in excess of their respective thresholds. The bypass logic circuit 170 further includes an output configured to generate an output control signal 178 that is asserted logic high when the circuit 100 is operating in bypass mode. Bypass mode is entered when the power up sequence of the integrated circuit is completed (see, FIG. 2 described below) as indicated by assertion of the signals 172, 174 and 176. When operating in bypass mode, the lower supply voltage VDDLV is instead applied externally from a testing circuit and the voltage regulator within the integrated circuit is maintained in a power down state. Testing of the integrated circuitry is performed during bypass mode.

A sixth logic AND gate 148 logically combines the output 104a of the POR circuit 102a, the output 104b of the POR circuit 102b and the output control signal 178. In operation, the output 158 of the sixth logic AND gate 148 is logic low if any one or more of the outputs 104a and 104b and control signal 178 are logic low, and is logic high only if all of the outputs 104a and 104b and control signal 178 are logic high.

A reset logic circuit 180 has inputs for receiving the first reset signal 162, the second reset signal 166 and the third reset signal 168. The reset logic circuit 180 controls operations for performing a reset of the integrated circuit device in response to any one or more of the first reset signal 162, the second reset signal 166 or the third reset signal 168 being in the logic low state. In response to a reset, the reset logic circuit 180 asserts a logic low control signal 182.

A seventh logic AND gate 178 logically combines the output 158 of the sixth logic AND gate 148 and the control signal 182. In operation, the output 188 of the seventh logic AND gate 178 that is logic low if any one or more of the output 158 of the sixth logic AND gate 148 or the control signal 182 are logic low, and is logic high only if both the output 158 of the sixth logic AND gate 148 and the control signal 182 are logic high.

A pad circuit 190 is configured to drive a pin 192 of the integrated circuit device. The pad circuit 190 includes buffer that is enabled (EN) in response to the logic low value of the signal 188. The buffer of the pad circuit 190 has an input configured to receive a logic low data value D and an output connected to the pin 192. A pull-up resistor R is coupled to the pin 192 at the output of the buffer. It will be noted that the pull-up resistor R is a weak signal and the data signal D is a strong signal. When the buffer within the pad circuit 190 is not enabled, the weak pull-up is present on the pin 192. Conversely, when the buffer within the pad circuit 190 is enabled, the logic low data value D is driven on the pin 192.

The mask signal and the functional operation of the OR gates 160 are 164 are important for controlling the scope of the testing operation. The threshold voltages for the maskable voltage monitoring circuits 112a-112b may be sufficiently high so as to impede the ability to explicitly test the POR circuits 102a-102b and unmaskable voltage monitoring circuits 114a and 114b. If the higher/lower supply voltages fall below the applicable thresholds for the maskable voltage monitoring circuits 112a-112b, their output signals 122a-122b will transition to logic low, propagate through the logic of the AND gates 140 and 142 and cause the reset circuit 180 to assert the reset control signal 182. If the mask signal is set at logic high, however, the OR gates 160 are 164 ensure that the first and second reset signals 162, 166 remain at logic high and do not trip the reset operation. In this condition, operation of the POR circuits 102a-102b and unmaskable voltage monitoring circuits 114a and 114b can be explicitly tested in response to varying the voltage of the lower and higher supply voltages (VDDLV and VDDHV) as well as the test supply voltage (VT).

Figure 2:
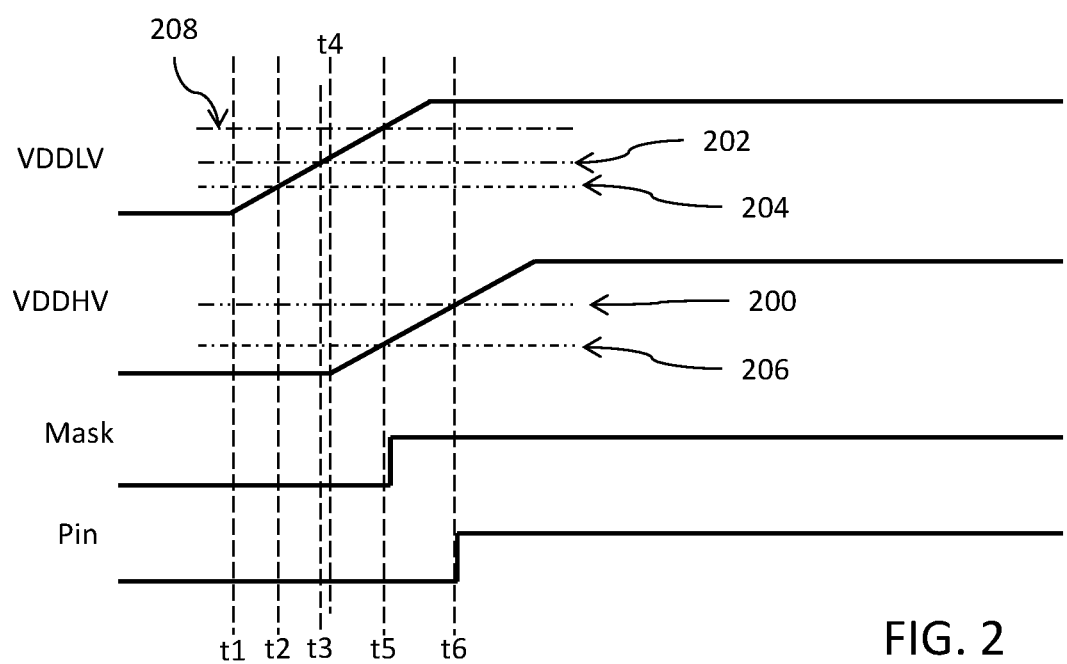
FIG. 2 shows signal timing for a power-up testing.

Reference is now made to FIG. 2 showing signal timing for a power-up testing of the POR circuits 102a and 102b as well as the unmaskable voltage monitoring circuits 114a and 114b. When performing this test, the bypass circuit 170 is enabled to bypass operation of the voltage regulator circuit. Both the higher power supply VDDHV and the lower power supply VDDLV are externally applied supply voltage from the testing circuit. The testing circuit can control both the timing and rate of change of the supply voltages.

At time t1, the lower power supply VDDLV begins to ramp up. At time t2, the lower power supply voltage VDDLV exceeds the threshold 204 of the low voltage POR circuit 102a. The output 104a of the low voltage POR circuit 102a accordingly transitions to logic high at this time. At time t3, the rising lower power supply voltage VDDLV exceeds the threshold 202 of the unmaskable low voltage monitoring circuit 114a. As discussed above, however, the unmaskable low voltage monitoring circuit 114a is powered from the higher power supply VDDHV, which is currently at 0 volts, and thus the unmaskable low voltage monitoring circuit 114a is not yet operational. At time t4, the higher power supply VDDHV begins to ramp up. At time t5, the higher power supply voltage VDDHV exceeds the threshold 206 of the high voltage POR circuit 102b. The output 104b of the high voltage POR circuit 102b accordingly transitions to logic high at this time. At this point in time, the level of the higher power supply voltage VDDHV is sufficient and the voltage monitoring circuits 110 are now powered. Because the lower power supply voltage VDDLV at level 208 now well exceeds the threshold 202 of the unmaskable low voltage monitoring circuit 114a, the output 124a of that unmaskable voltage monitoring circuit 114a accordingly transitions to logic high at this time. With sufficient higher power supply voltage VDDHV available on the integrated circuit device, the Mask signal is asserted to block the signals output from the maskable voltage monitors 112a and 112b. The OR gates 160 and 164 each output logic high reset signals 162 and 166. The signals 172, 174 and 176 are further processed by the bypass circuit 170 to cause entry into bypass mode of operation. The output signal 178 is asserted logic high. At time t6, the rising higher power supply voltage VDDHV exceeds the threshold 200 of the unmaskable high voltage monitoring circuit 114b. The output 104b of the high voltage POR circuit 102b accordingly transitions to logic high at this time. The AND gate 166 outputs a logic high value for the reset signal 168. The reset logic circuit 180 responds to the signals 162, 166 and 168 by asserting a logic high signal 182. The AND gates 148 and 178 respond to the signals 104a, 104b, 178 and 182 by asserting a logic high signal 188 to the enable input of the buffer within the pad circuit 190. The buffer is accordingly disabled from operation and the output pin 192 is weakly pulled up pulled to the higher power supply voltage VDDHV at time t6 through the resistor R of the pad circuit 190. This change in the logic state of at the pin 192 shows that low voltage POR circuit 102a, high voltage POR circuit 102b, unmaskable low voltage monitoring circuit 114a and unmaskable high voltage monitoring circuit 114b are all properly working.

Figure 3:
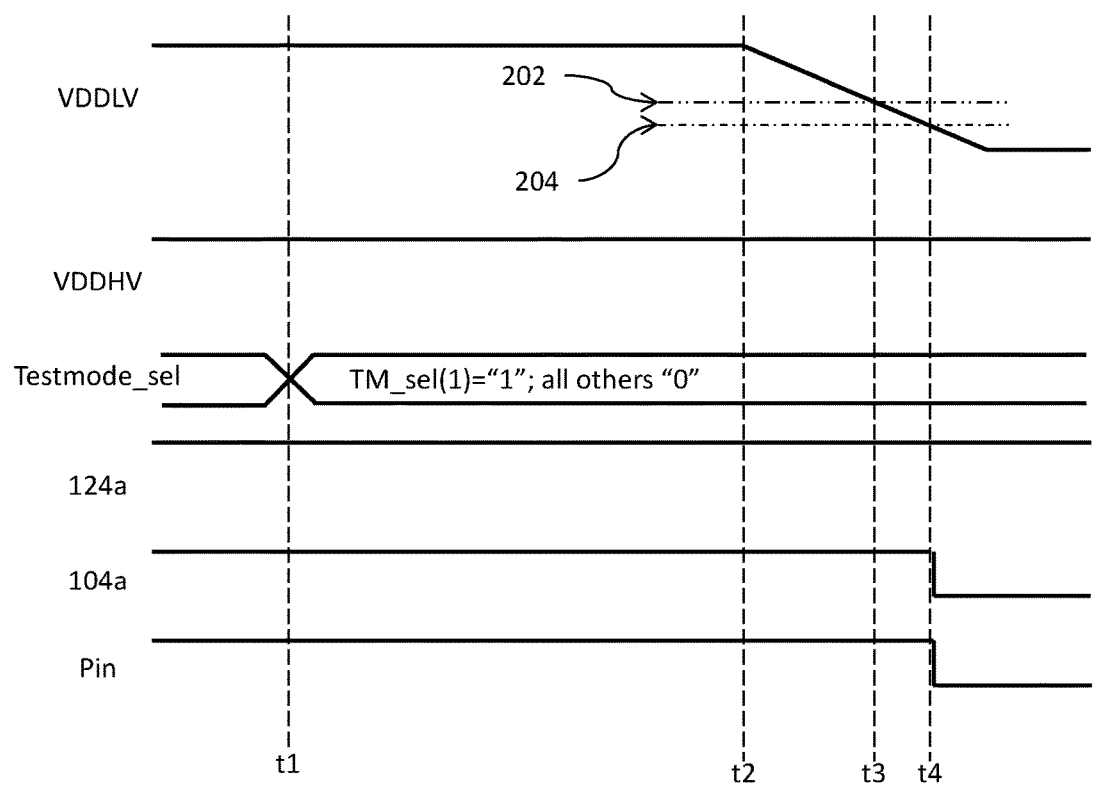
FIG. 3 shows signal timing for a power-down testing of a power on reset circuit.

Reference is now made to FIG. 3 showing signal timing for a power-down testing of the low voltage POR circuit 102a. In this operation, the mask signal is asserted logic high to mask the outputs of the maskable voltage monitoring circuits 112a-112b. Furthermore, the test supply voltage (VT) is set to a voltage level in excess of the threshold voltage 202 of the unmaskable low voltage monitoring circuit 114a and the higher power supply VDDHV is fixed at a high value. At time t1, the Testmode_sel signal has a data value that causes the TM_sel(1) signal to be logic high and all other TM_sel signals to be logic low. In response thereto, the analog multiplexer 120 with an output coupled to the unmaskable low voltage monitoring circuit 114a is configured to pass the test supply voltage VT for application as the voltage 118. In this condition, the output 124 of the unmaskable low voltage monitoring circuit 114a will remain at logic high regardless of change in the lower power supply voltage VDDLV as long as the test supply voltage (VT) remains above the threshold 202. At time t2, the lower power supply voltage VDDLV begins to ramp down. At time t3, the lower power supply voltage falls below the threshold 202 of the unmaskable low voltage monitoring circuit 114a. The output 124a of the unmaskable low voltage monitoring circuit 114a, however, does not change state to the logic low value, but rather remains at the logic high voltage because the analog multiplexer 120 is supplying the unmaskable low voltage monitoring circuit 114a with the test supply voltage (VT) in response to the instructions of the Testmode_sel signal (with TM_sel(1)="1"). At time t4, the lower power supply voltage VDDLV falls below the threshold 204 of the low voltage POR circuit 102a. The output signal 104a changes to the logic low value, and this logic state propagates through the AND gates 148 and 178 to cause the signal 188 to also be logic low. The buffer within the pad circuit 190 is thus enabled and the data value D of logic "0" is passed by the buffer to the pin 192. In response to this change in the logic state of at the pin 192 coincident with the ramp down of the lower power supply voltage VDDLV below the threshold of the low voltage POR circuit 102a, the tester can confirm proper operation of the low voltage POR circuit 102a.

It will be noted that because the higher power supply voltage VDDHV and test supply voltage (VT) are fixed with voltage values in excess of the measurement thresholds of the high voltage POR circuit 102b, unmaskable high voltage monitoring circuit 114b and unmaskable low voltage monitoring circuit 114a, there is no possibility for any of these circuits to cause a reset through the reset logic circuit 180. Control is exercised over changing the voltage of only the lower power supply voltage VDDLV, and thus only the low voltage POR circuit 102a will respond to that change below the threshold 204 of the low voltage POR circuit 102a to cause a reset that is detected by the state change at the pin 192.

Figure 4:
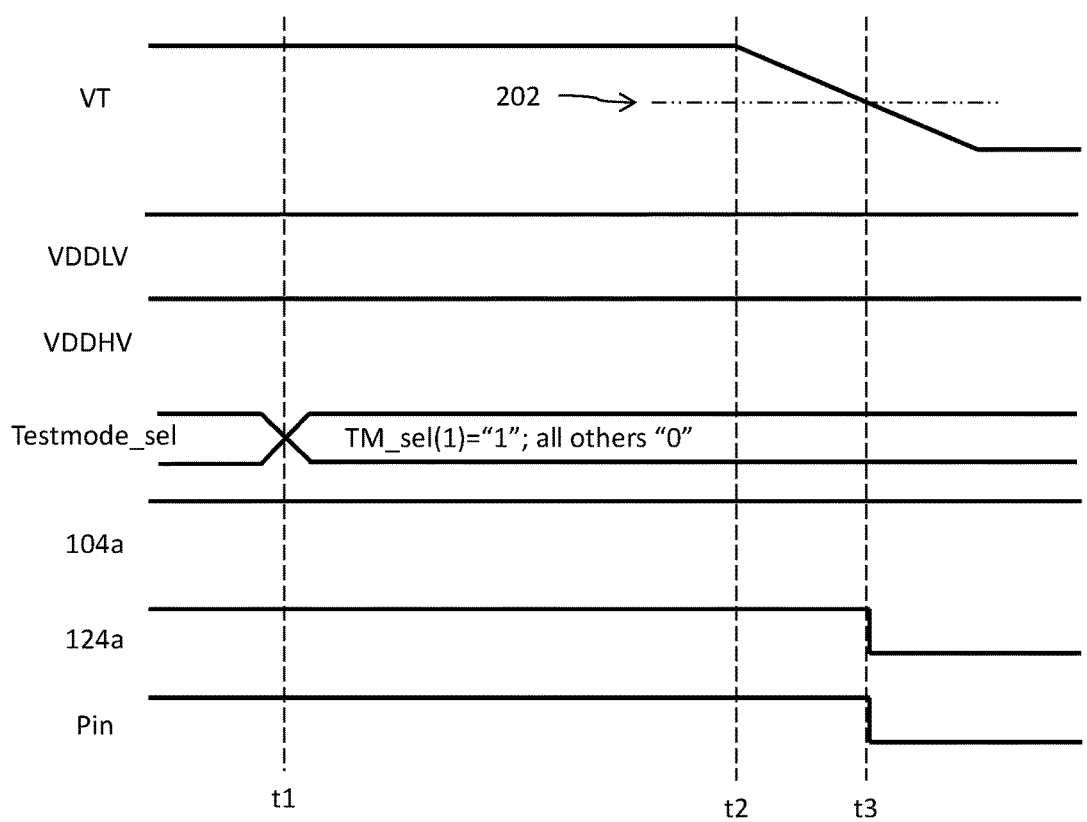
FIG. 4 shows signal timing for a power-down testing of an unmaskable voltage monitoring circuit.

Reference is now made to FIG. 4 showing signal timing for a power-down testing of the unmaskable low voltage monitoring circuit 114a. In this operation, the mask signal is asserted logic high to mask the outputs of the maskable voltage monitoring circuits 112a-112b. Furthermore, the test supply voltage (VT) is initially set to a voltage level in excess of the threshold 202 voltage of the unmaskable low voltage monitoring circuit 114a and the lower and higher power supply voltages VDDLV and VDDHV are fixed at their high values. At time t1, the Testmode_sel signal has a data value that that causes the TM_sel(1) signal to be logic high and all other TM_sel signals to be logic low. In response thereto, the analog multiplexer 120 with an output coupled to the unmaskable low voltage monitoring circuit 114a is configured to pass the test supply voltage VT for application as the voltage 118. At time t2, the test supply voltage (VT) begins to ramp down. At time t3, the test supply voltage (VT) falls below the threshold 202 of the unmaskable low voltage monitoring circuit 114a. The output signal 124a changes to the logic low value, and this logic state propagates through the AND gates 144 and 166, reset circuit 180 and AND gate 178 to cause the signal 188 to also be logic low. The buffer within the pad circuit 190 is thus enabled and the data value D of logic "0" is passed by the buffer to the pin 192. In response to this change in the logic state of at the pin 192 coincident with the ramp down of the test supply voltage (VT) below the threshold 202 of the unmaskable low voltage monitoring circuit 114a, the tester can confirm proper operation of the unmaskable low voltage monitoring circuit 114a.

It will be noted that because the higher power supply voltage VDDHV and lower power supply voltage VDDLV are fixed with voltage values in excess of the measurement thresholds of the high voltage POR circuit 102b, low voltage POR circuit 102a and unmaskable high voltage monitoring circuit 114b, there is no possibility for any of these circuits to cause a reset. Control is exercised over changing the voltage of only the test supply voltage (VT), and thus only the unmaskable low voltage monitoring circuit 114a (selected through the Testmode_sel signal) will respond to that change below the threshold 202 of the unmaskable low voltage monitoring circuit 114a to cause a reset that is detected by the change in state at the pin 192.

Figure 5:
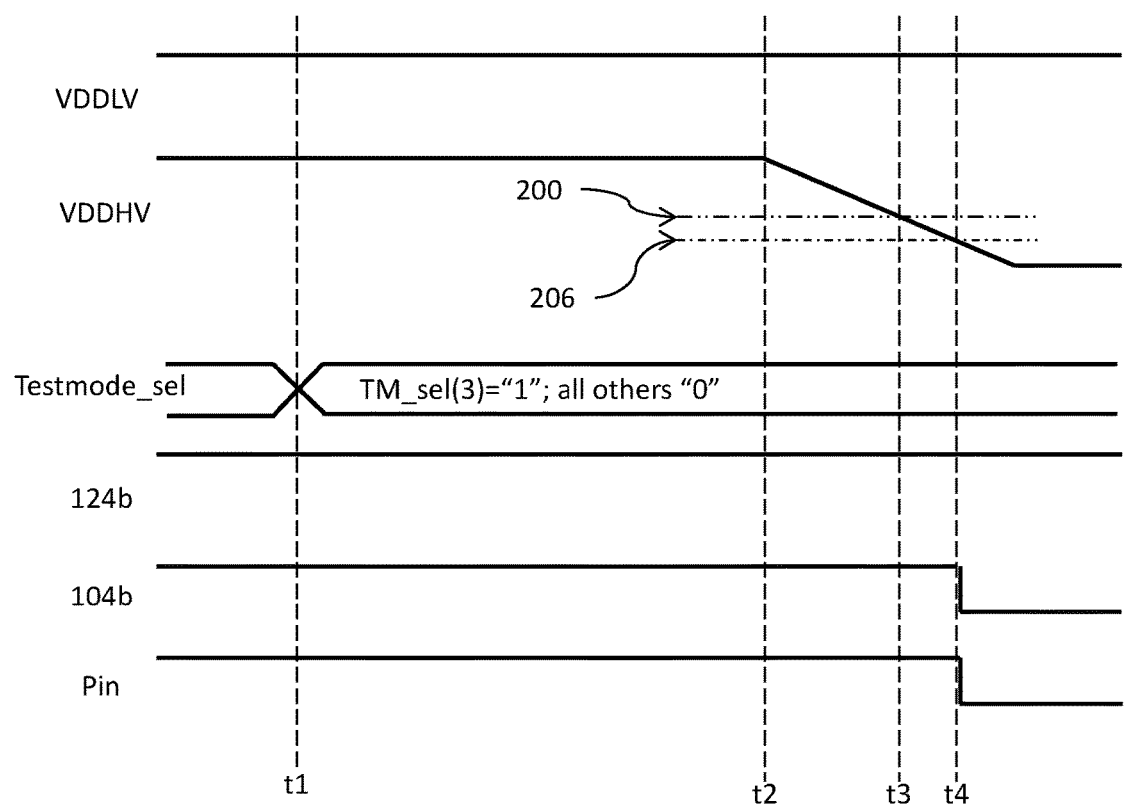
FIG. 5 shows signal timing for a power-down testing of a power on reset circuit.

Reference is now made to FIG. 5 showing signal timing for a power-down testing of the high voltage POR circuit 102b. In this operation, the mask signal is asserted logic high to mask the outputs of the maskable voltage monitoring circuits 112a-112b. Furthermore, the test supply voltage (VT) is set to a voltage level in excess of the threshold voltage 200 of the unmaskable high voltage monitoring circuit 114b and the lower power supply voltage VDDLV is fixed at a high value. At time t1, the Testmode_sel signal has a data value that causes the TM_sel(3) signal to be logic high and all other TM_sel signals to be logic low. In response thereto, the analog multiplexer 120 with an output coupled to the unmaskable high voltage monitoring circuit 114b is configured to pass the test supply voltage VT for application as the voltage 118. In this condition, the output 124b of the unmaskable high voltage monitoring circuit 114b will remain at logic high regardless of change in the high power supply voltage VDDHV as long as the test supply voltage (VT) remains above the threshold 200. At time t2, the higher power supply voltage VDDHV begins to ramp down. At time t3, the higher power supply voltage falls below the threshold 200 of the unmaskable high voltage monitoring circuit 114b. The output 124b of the unmaskable high voltage monitoring circuit 114b, however, does not change state to the logic low value, but rather remains at the logic high voltage because the analog multiplexer 120 is supplying the unmaskable high voltage monitoring circuit 114b with the test supply voltage (VT) in response to the instructions of the Testmode_sel signal (with TM_sel(3)="1"). At time t4, the higher power supply voltage VDDHV falls below the threshold 206 of the high voltage POR circuit 102b. The output signal 104b changes to the logic low value, and this logic state propagates through the AND gates 148 and 178 to cause the signal 188 to also be logic low. The buffer within the pad circuit 190 is thus enabled and the data value D of logic "0" is passed by the buffer to the pin 192. In response to this change in the logic state of at the pin 192 coincident with the ramp down of the higher power supply voltage VDDHV below the threshold of the high voltage POR circuit 102b, the tester can confirm proper operation of the high voltage POR circuit 102b.

It will be noted that because the lower power supply voltage VDDLV and test supply voltage (VT) are fixed with voltage values in excess of the measurement thresholds of the low voltage POR circuit 102a, unmaskable high voltage monitoring circuit 114b and unmaskable low voltage monitoring circuit 114a, there is no possibility for any of these circuits to cause a reset through the reset logic circuit 180. Control is exercised over changing the voltage of only the higher power supply voltage VDDHV, and thus only the high voltage POR circuit 102b will respond to that change below the threshold 206 of the high voltage POR circuit 102b to cause a reset that is detected by the state change at the pin 192.

Figure 6:
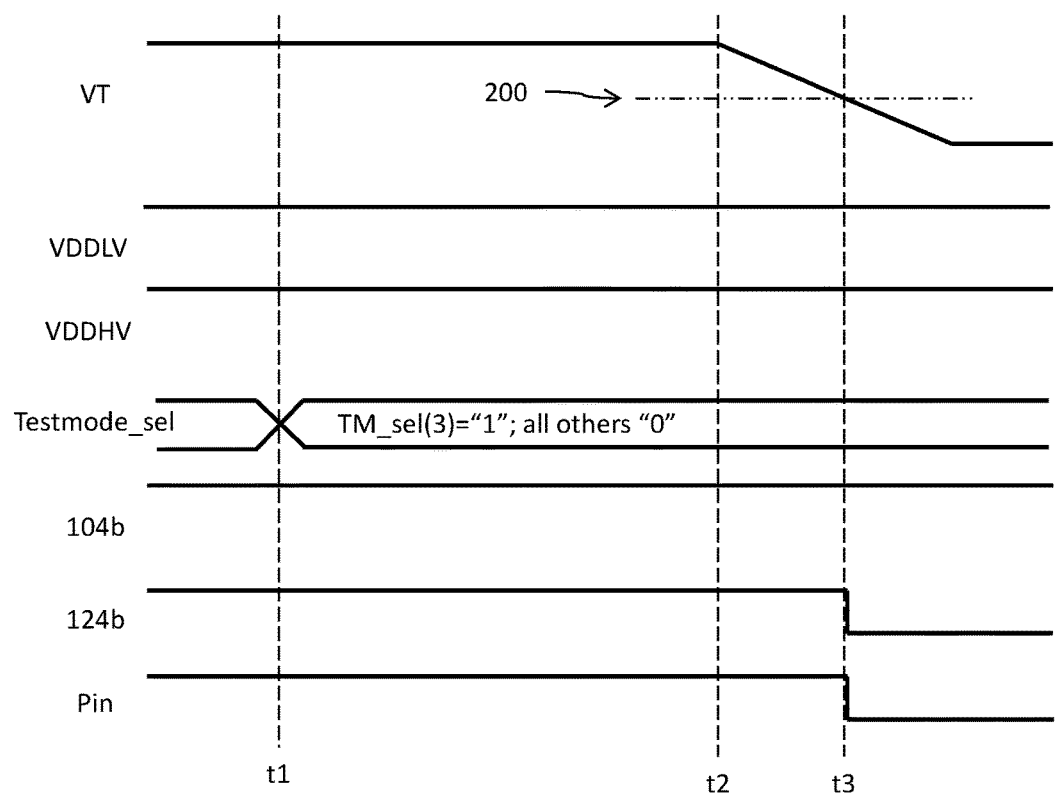
FIG. 6 shows signal timing for a power-down testing of an unmaskable voltage monitoring circuit.

Reference is now made to FIG. 6 showing signal timing for a power-down testing of the unmaskable high voltage monitoring circuit 114b. In this operation, the mask signal is asserted logic high to mask the outputs of the maskable voltage monitoring circuits 112a-112b. Furthermore, the test supply voltage (VT) is initially set to a voltage level in excess of the threshold 200 voltage of the unmaskable high voltage monitoring circuit 114b. At time t1, the Testmode_sel signal has a data value that that causes the TM_sel(3) signal to be logic high and all other TM_sel signals to be logic low. In response thereto, the analog multiplexer 120 with an output coupled to the unmaskable high voltage monitoring circuit 114b is configured to pass the test supply voltage VT for application as the voltage 118 and the lower and higher power supply voltages VDDLV and VDDHV are fixed at their high values. At time t2, the test supply voltage (VT) begins to ramp down. At time t3, the test supply voltage (VT) falls below the threshold 200 of the unmaskable high voltage monitoring circuit 114b. The output signal 124b changes to the logic low value, and this logic state propagates through the AND gates 146 and 166, reset circuit 180 and AND gate 178 to cause the signal 188 to also be logic low. The buffer within the pad circuit 190 is thus enabled and the data value D of logic "0" is passed by the buffer to the pin 192. In response to this change in the logic state of at the pin 192 coincident with the ramp down of the test supply voltage (VT) below the threshold 200 of the unmaskable high voltage monitoring circuit 114b, the tester can confirm proper operation of the unmaskable high voltage monitoring circuit 114b.

It will be noted that because the higher power supply voltage VDDHV and lower power supply voltage VDDLV are fixed with voltage values in excess of the measurement thresholds of the high voltage POR circuit 102b, low voltage POR circuit 102a and unmaskable low voltage monitoring circuit 114a, there is no possibility for any of these circuits to cause a reset. Control is exercised over changing the voltage of only the test supply voltage (VT), and thus only the unmaskable high voltage monitoring circuit 114b (selected through the Testmode_sel signal) will respond to that change below the threshold 200 of the unmaskable high voltage monitoring circuit 114b to cause a reset that is detected by the change in state at the pin 192.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
an analog multiplexer circuit having a first input configured to receive a supply voltage and a second input configured to receive a test voltage, said analog multiplexer having an output generating an input voltage comprising one of said supply voltage and the test voltage that is selected by a control signal; and
a voltage monitor circuit configured to compare the input voltage to a threshold voltage and generate an output voltage signal;
wherein the control signal selects the supply voltage in a normal operating mode and alternatively selects the test voltage in a test operating mode.

2. The circuit of claim 1, further comprising a first logic circuit configured to logically combine the output voltage signal with a first reset signal generated by a first reset circuit, wherein the test voltage is fixed at a voltage level in excess of the threshold voltage when the test operating mode functions to test operation of the first reset circuit.

3. The circuit of claim 2, wherein the test voltage is decreased from the voltage level in excess of the threshold voltage to a voltage level less than the threshold voltage when the test operating mode functions to test operation of the voltage monitor circuit.

4. The circuit of claim 2, wherein the first reset circuit is a power on reset circuit operating to monitor the supply voltage and wherein the supply voltage is varied when the test operating mode functions to test operation of the first reset circuit.

5. The circuit of claim 2, further comprising:
a second reset circuit configured to generate a second reset signal in response to an output of the first logic circuit; and
a second logic circuit configured to logically combine the first and second reset signals to generate an enable signal.

6. The circuit of claim 5, further comprising:
a buffer circuit having a data input configured to receive a data value, an enable input configured to receive said enable signal and an output; and
a pull-up circuit coupled to the output.

7. The circuit of claim 1, wherein the test voltage is decreased from a voltage level in excess of the threshold voltage to a voltage level less than the threshold voltage when the test operating mode functions to test operation of the voltage monitor circuit.

8. A testing method, comprising:
applying a supply voltage to a reset circuit;
comparing the supply voltage to a reset voltage using the reset circuit and generating a first reset signal;
applying a fixed test voltage to a voltage monitoring circuit in substitution for application of said supply voltage;
comparing the fixed test voltage to a threshold voltage using the voltage monitoring circuit, wherein the fixed test voltage is in excess of the threshold voltage, to generate an output signal;
logically combining the first reset signal and the output signal to generate a second reset signal;
decreasing the supply voltage applied to the reset circuit; and
monitoring for a change of state of the second reset signal in response to the decreasing supply voltage.

9. The method of claim 8, wherein applying the fixed test voltage comprises analog multiplexing the fixed test voltage and the supply voltage for application to said voltage monitoring circuit.

10. A testing method, comprising:
applying a supply voltage to a reset circuit;
comparing the supply voltage to a reset voltage using the reset circuit and generating a first reset signal;
applying a variable test voltage to a voltage monitoring circuit in substitution for application of said supply voltage;
comparing the variable test voltage to a threshold voltage using the voltage monitoring circuit, wherein the variable test voltage has an initial value in excess of the threshold voltage, to generate an output signal;
logically combining the first reset signal and the output signal to generate a second reset signal;
decreasing the variable test voltage applied to the voltage monitoring circuit; and
monitoring for a change of state of the second reset signal in response to the decreasing variable test voltage falling below the threshold voltage.

11. The method of claim 10, wherein applying the variable test voltage comprises analog multiplexing the variable test voltage and the supply voltage for application to said voltage monitoring circuit.

\* \* \* \* \*